(12) United States Patent
Colombo et al.

(10) Patent No.: US 6,242,845 B1
(45) Date of Patent: Jun. 5, 2001

(54) ELECTRONIC DRIVING CIRCUIT FOR A BISTABLE ACTUATOR

(75) Inventors: Franco Colombo, Malnate; Donato Colonna; Angelo Manara, both of Milan; Walter Turati, Sesto San Giovanni; Salvatore Brandonisio, Milan, all of (IT)

(73) Assignee: ABB Ricerca SpA, Sesto San Giovanni (IT)

( * ) Notice: Subject to any disclaimer, the term of this patent is extended or adjusted under 35 U.S.C. 154(b) by 0 days.

(21) Appl. No.: 09/471,087

(22) Filed: Dec. 23, 1999

(30) Foreign Application Priority Data

Dec. 24, 1998 (IT) .............................................. MI98A2828

(51) Int. Cl.[7] .................. H01L 310/317; H04B 340/407

(52) U.S. Cl. ....................................... 310/317; 340/407.1

(58) Field of Search .......................... 310/317; 340/407.1

(56) References Cited

U.S. PATENT DOCUMENTS

| 4,212,513 | * | 7/1980 | Gravel | 310/317 |
| 4,380,759 | * | 4/1983 | Sulkoski | 340/407.1 |

FOREIGN PATENT DOCUMENTS

| 1.525.998 | * | 2/1967 | (FR) | 310/317 |

* cited by examiner

Primary Examiner—Nestor Ramirez
Assistant Examiner—Karen Addison
(74) Attorney, Agent, or Firm—Oblon, Spivak, McClelland, Maier & Neustadt, P.C.

(57) ABSTRACT

An electronic driving circuit for a bistable actuator activated by piezoelectric elements, particularly for residual-current devices, the circuit including a voltage step-up device suitable to step up and store a voltage generated across a secondary winding of a current sensor. The step-up device is connected to a threshold setting device suitable to determine an intervention threshold of a bistable actuator activated by piezoelectric elements, whose activation is determined by an excitation voltage applied across the bistable actuator which is higher than the voltage threshold set by the threshold setting device.

15 Claims, 5 Drawing Sheets

ELECTRONIC DRIVING CIRCUIT FOR A BISTABLE ACTUATOR

CROSS-REFERENCE TO RELATED APPLICATIONS

This application claims priority from Italian Application No. MI98A002828 filed Dec. 24, 1998, the entire contents of which is incorporated herein by reference.

BACKGROUND OF THE INVENTION

1. Field of the Invention

The present invention relates to an electronic driving circuit for a bistable actuator activated by piezoelectric elements, particularly suitable for use in residual-current devices such as for example residual-current circuit breakers; the electronic driving circuit according to the invention will be described with particular reference to a residual-current circuit breaker without intending in any way to limit its scope of application.

2. Description of the Related Art

It is known that a residual-current circuit breaker is an automatic circuit breaker for AC circuits which opens when the vector sum of the currents in the conductors of the circuit, which is zero in normal conditions, exceeds a preset value.

Residual-current circuit breakers are meant to prevent metallic parts, such as the enclosures of appliances and the metallic masses of the protected area, connected to an earth system of appropriate resistance, from becoming live ("indirect protection") and, if sufficiently sensitive and fast-acting, can in certain conditions also provide protection against contact with parts which are normally live ("direct protection"). The main characteristic of residual-current circuit breakers is that they achieve extremely short circuit opening and closing times.

A residual-current circuit breaker is shown schematically in FIG. 1. The circuit breaker comprises a current sensor 1 for detecting the differential fault current and which is generally constituted by a toroidal core made of magnetic material. Neutral 2 and the phase 3 of an electric line pass through the core so as to constitute the primary windings of a step-up transformer and are then connected to a system with its loads designated by the reference numeral 10. Secondary winding 4 across which a voltage is generated when the fault current is present also passes through the core. An electronic coupling circuit 5 present between the current sensor 1 and an actuator 6, is supplied by the voltage generated across the secondary winding 4 and drives a release and disengagement mechanism 7 for opening contacts 8 and 9 of the circuit if an earth fault current is present.

Conventional actuators used in residual-current circuit breakers are of the electromagnetic type (electromagnetic relay of the demagnetization type) and have several drawbacks. First they are sensitive to magnetic fields and this alters their operation. For example, the presence of an external magnetic field can produce an unwanted and unwarranted actuation of the actuator. An external magnetic field might also alter the magnetization of the electromagnetic relay, accordingly altering the sensitivity of the residual-current circuit breaker. Moreover, conventional actuators are sensitive to impacts and vibrations and have a complicated mechanical construction which leads to high cost.

In order to obviate all of these drawbacks, bistable actuators activated by piezoelectric elements have been studied. However these devices need to be excited with a voltage pulse which has specific characteristics, in terms of amplitude and rise time, that are substantially different from the pulse supplied by currently available electronic devices for coupling the sensor and the actuator, normally used with electromagnetic relays. Moreover, conventional driving circuits coupled to conventional actuators convert available energy, coupled by the secondary winding of the current sensor 1, mostly in terms of current, not in terms of voltage as required by piezoelectric element-activated actuators.

SUMMARY OF THE INVENTION

The aim of the present invention is to provide an electronic driving circuit for a testable actuator activated by piezoelectric elements, particularly for residual-current devices, which allows the supply of a voltage pulse having characteristics, in terms of amplitude and rise time, which are suitable for use with piezoelectric actuators.

Within the scope of this aim, an object of the present invention is to provide an electronic driving circuit for a bistable actuator activated by piezoelectric elements which allows utilization of the minimal energy provided by the current sensor of a residual-current circuit breaker for conversion into a voltage pulse.

Another object of the present invention is to provide an electronic driving circuit for a bistable actuator activated by piezoelectric elements which is substantially insensitive to magnetic fields.

Yet another object of the present invention is to provide an electronic driving circuit for a bistable actuator activated by piezoelectric elements which is particularly suitable for residual-current circuit breakers and accordingly achieves short response times.

Still another object of the present invention is to provide an electronic driving circuit for a bistable actuator activated by piezoelectric elements which is highly reliable, relatively easy to provide and at competitive costs.

This aim, these objects and others which will become apparent hereinafter are achieved by an electronic driving circuit for a bistable actuator activated by piezoelectric elements characterized in that it comprises voltage step-up means which are suitable to step up and store a voltage generated across a secondary winding of a current sensor, said step-up means being connected to threshold setting means which are suitable to determine an intervention voltage threshold of the bistable actuator whose activation is determined by an excitation voltage applied across it which is higher than the voltage threshold set by said threshold setting means.

BRIEF DESCRIPTION OF THE DRAWINGS

Further characteristics and advantages of the invention will become apparent from the following detailed description of preferred but not exclusive embodiments of the electronic circuit according to the invention, illustrated only by way of non-limitative example in the accompanying drawings, wherein.

DESCRIPTION OF THE PREFERRED EMBODIMENTS

Figure 1:
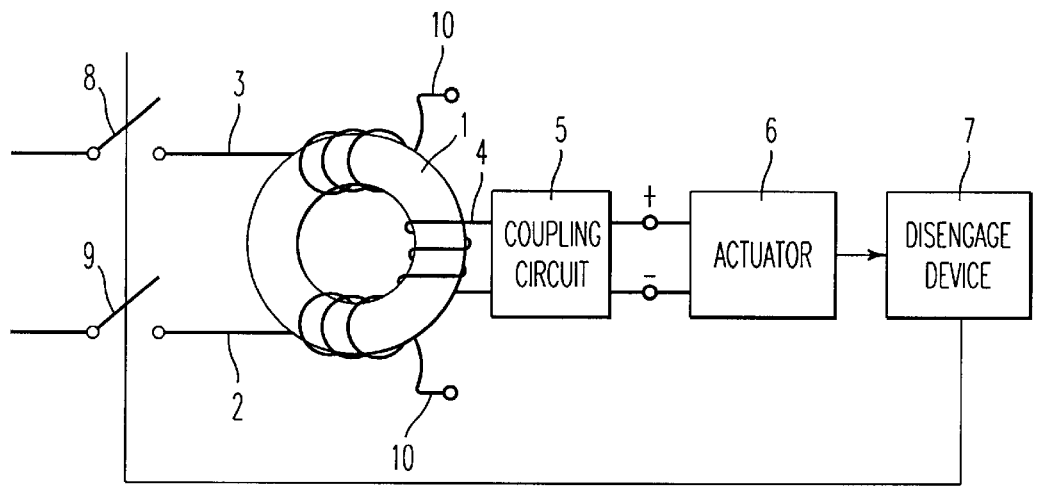
FIG. 1 is a schematic block diagram of a conventional residual-current circuit breaker.
Figure 2:
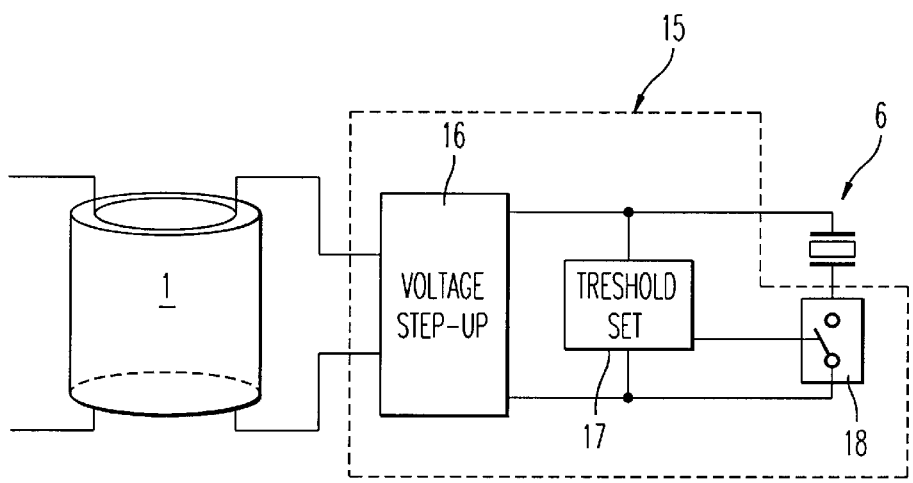
FIG. 2 is a general block diagram of the electronic driving circuit according to the present invention.

With reference to FIGS. 2 to 8, the electronic driving circuit according to the present invention, illustrated by way of example as a block diagram in FIG. 2 and designated by the reference numeral 15, comprises voltage step-up means 16 which are input-connected to the secondary winding of a current sensor 1, and are output-connected to threshold setting means 17 which are suitable to set an intervention voltage threshold which is proportional to the nominal value of the residual current at which the residual-current device, for example, the residual-current circuit breaker, is to intervene.

A piezoelectric bistable actuator 6 is connected to the threshold setting means 17. The actuator 6, not shown in detail in the figures, can comprise a substantially rectangular metallic lamina. Two layers of piezoelectric material are arranged on opposite surfaces of an end of the lamina, and they are positioned substantially parallel to each other in a bimorph configuration with the metallic lamina interposed between them. The actuator 6 is positioned in a pre-loaded configuration, corresponding to a first stable equilibrium position. A switching circuit 18 is provided in order to close the electric circuit across the piezoelectric actuator 6 under the control of the above-described threshold setting means 17.

Figure 3:
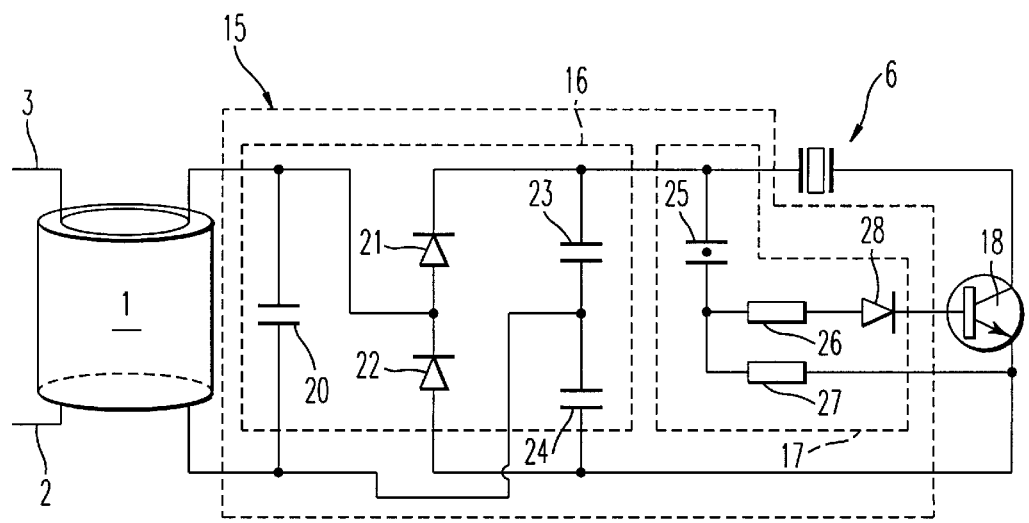
FIG. 3 is a view of a first embodiment of the electronic driving circuit according to the present invention.

A first embodiment of the electronic circuit according to the invention is shown in FIG. 3, in which the voltage step-up means 16, suitable to step up and store the voltage made available by the secondary winding of the sensor 1, comprise a capacitor 20, two diodes 21 and 22 and two further capacitors 23 and 24. The threshold setting means 17, in this embodiment, comprise a surge arrester 25 which, once the threshold value has been reached, supplies a starting pulse which is appropriately limited by resistors 26 and 27 and is transferred by a diode 28 to the subsequent switch 18, which is provided in this case by means of a bipolar transistor. The transistor therefore switches on, acting as a switch and accordingly closing the circuit of the piezoelectric actuator 6 so that the required voltage pulse is present across it. The threshold value is determined by the specifications of the surge arrester 25.

Figure 4:
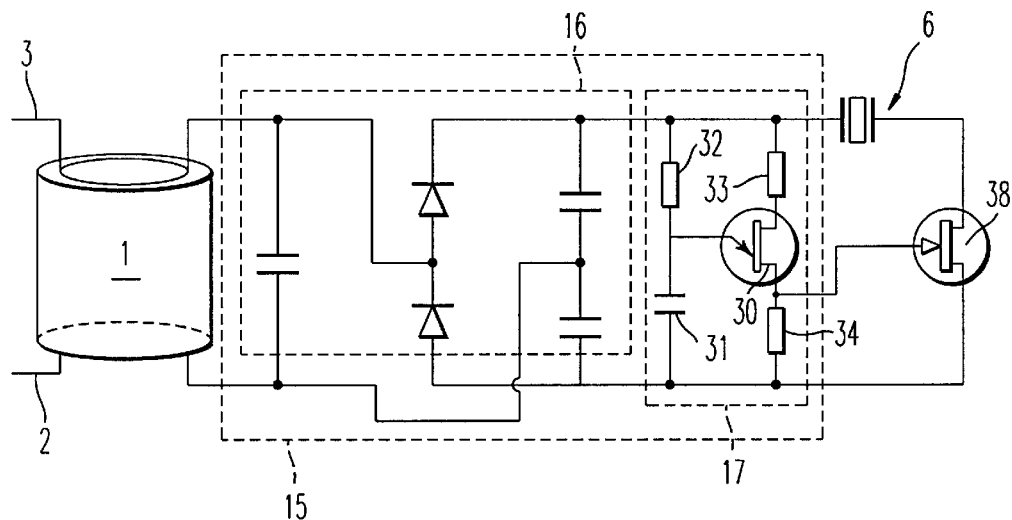
FIG. 4 is a view of a second embodiment of the electronic driving circuit according to the invention.

A second embodiment of the circuit according to the invention is shown in FIG. 4, in which the voltage step-up means 16 are similar to those shown in FIG. 3, whereas the threshold setting means 17 have a unijunction transistor 30 whose intervention voltage threshold is set by a capacitor 31 and by resistors 32, 33 and 34. The switch 38 is provided in this case. by a MOSFET which switches on when the unijunction transistor 30, after reaching the preset threshold conditions, provides it with a starting pulse. The MOSFET then acts as a switch, i.e., closing the circuit of the piezoelectric actuator 6 so that the required voltage pulse is present across it.

Figure 5:
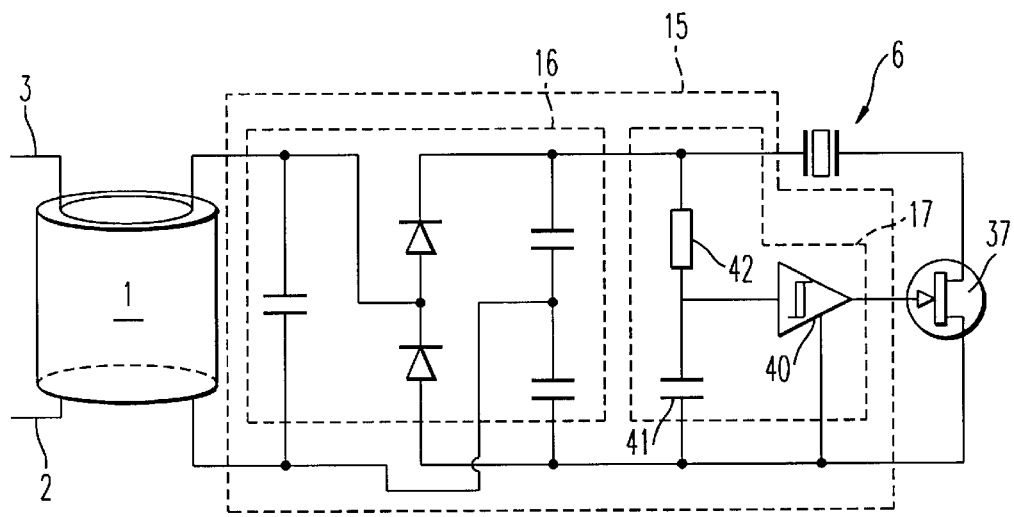
FIG. 5 is a view of a third embodiment of the electronic driving circuit according to the invention.

A third embodiment of the circuit according to the invention is shown in FIG. 5, in which the voltage step-up means 16 are similar to the ones described above, whereas the threshold setting means 17 comprise a voltage detector 40, also known as micropower undervoltage sensing circuit, whose intervention threshold is set by a divider, which comprises a capacitor 41 and a resistor 42. The switching block is provided, as in the second embodiment, by a MOSFET transistor 38 which switches on when the voltage detector 40, after reaching the preset threshold conditions, provides it with a starting pulse. The MOSFET then acts as a switch, i.e., closing the circuit of the piezoelectric actuator 6 so that the required voltage pulse is present across it.

Figure 6:
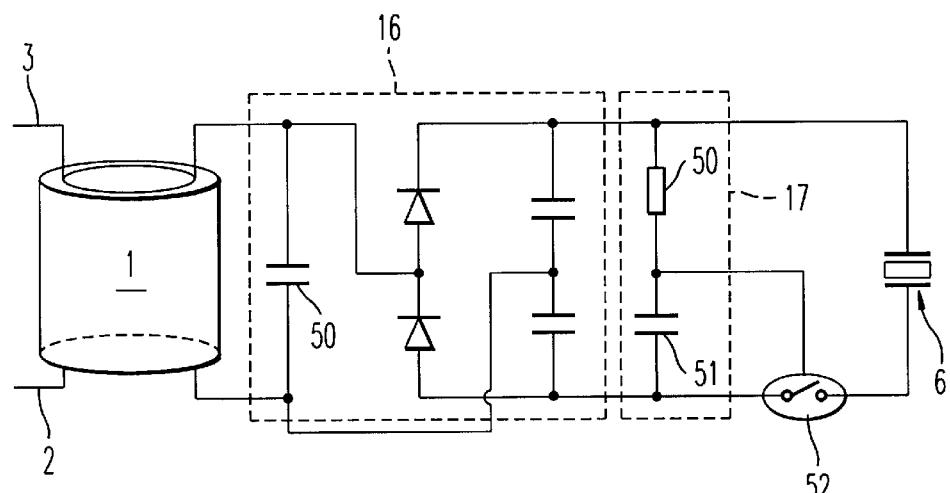
FIG. 6 is a view of a fourth embodiment of the electronic driving circuit according to the invention.

A fourth embodiment of the electronic circuit according to the invention is shown in FIG. 6, in which the voltage step-up means 16 are similar to the ones illustrated above. The threshold setting means 17 are provided in this case by means of a resistive/capacitive divider constituted by a resistor 50 arranged in series to a capacitor 51. The switching means of the preceding embodiments is provided, in this case, by an electrostatic relay 52, preferably a silicon micromachining relay, whose contact closes due to the electrostatic force generated when the voltage is applied to the control terminal of the switch. When the electrostatic relay closes, the energy accumulated by the preceding block 16 is transferred to the piezoelectric actuator 6.

The advantage offered by the electrostatic relay 52 resides in that it has a very low driving energy for assuming the closed state, and this entails a very high impedance of the control terminal. Moreover, electrostatic relay 52 has very fast switching times between closure and opening, much shorter than 1 ms, which prevents dissipating energy arriving from the current sensor 1. Since the energy is very low, it is important to be able to preserve enough to trip the actuator 6. The threshold voltage supplied by the threshold setting means can be adjusted appropriately by selecting the characteristics of the resistor 50 and of the capacitor 51.

Figure 7:
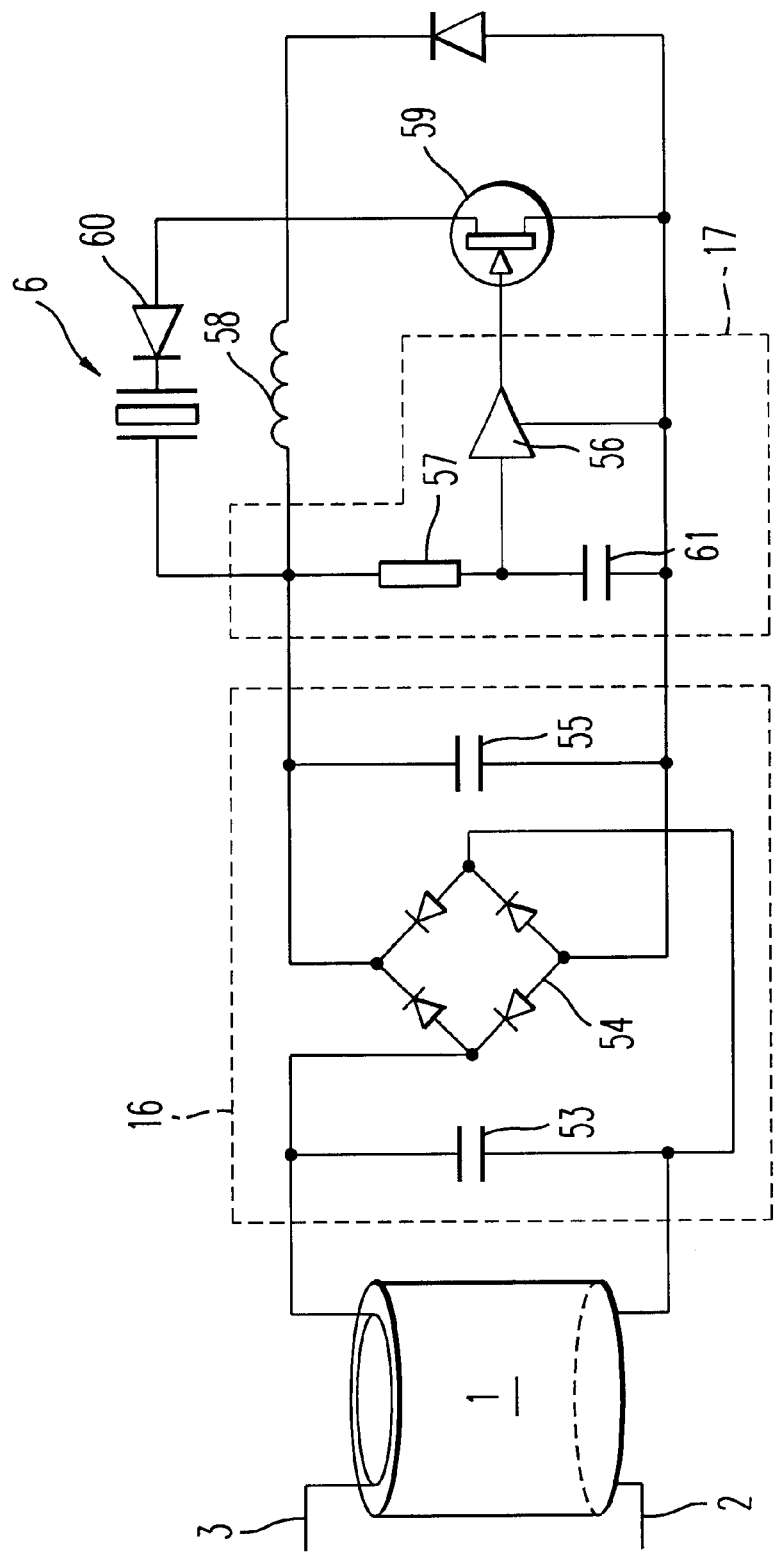
FIG. 7 is a view of a fifth embodiment of the electronic driving circuit according to the invention.

A fifth embodiment of the electronic circuit according to the invention is shown in FIG. 7, in which the voltage step-up means 16 comprise a capacitor 53, a diode bridge 54 and a capacitor 55 arranged in output to the diode bridge 54. The driving voltage to be used by the actuator 6 is also stepped up by a coil 58, as described hereinafter.

The threshold setting means 17 can be provided by means of any one of the devices shown in the preceding embodiments. FIG. 7, by way of example, illustrates the embodiment which uses the voltage detector 56, also known as micropower undervoltage sensing circuit, whose intervention threshold is set by the capacitor 61 and by the resistor 57 to a voltage value which is advantageously lower than in the other embodiments. This is possible because of the presence of the inductor 58 which accumulates energy in the presence of a residual current. Therefore, when the switching block 59 (similar to the switching means 18 and 38 of the preceding embodiments), again constituted by a MOSFET, is made to close, the inductor 58 accumulates energy from the voltage on the secondary winding of the sensor. This energy is then transferred toward the actuator 6 across the diode 60 when the MOSFET 59 suddenly reopens.

Figure 8:
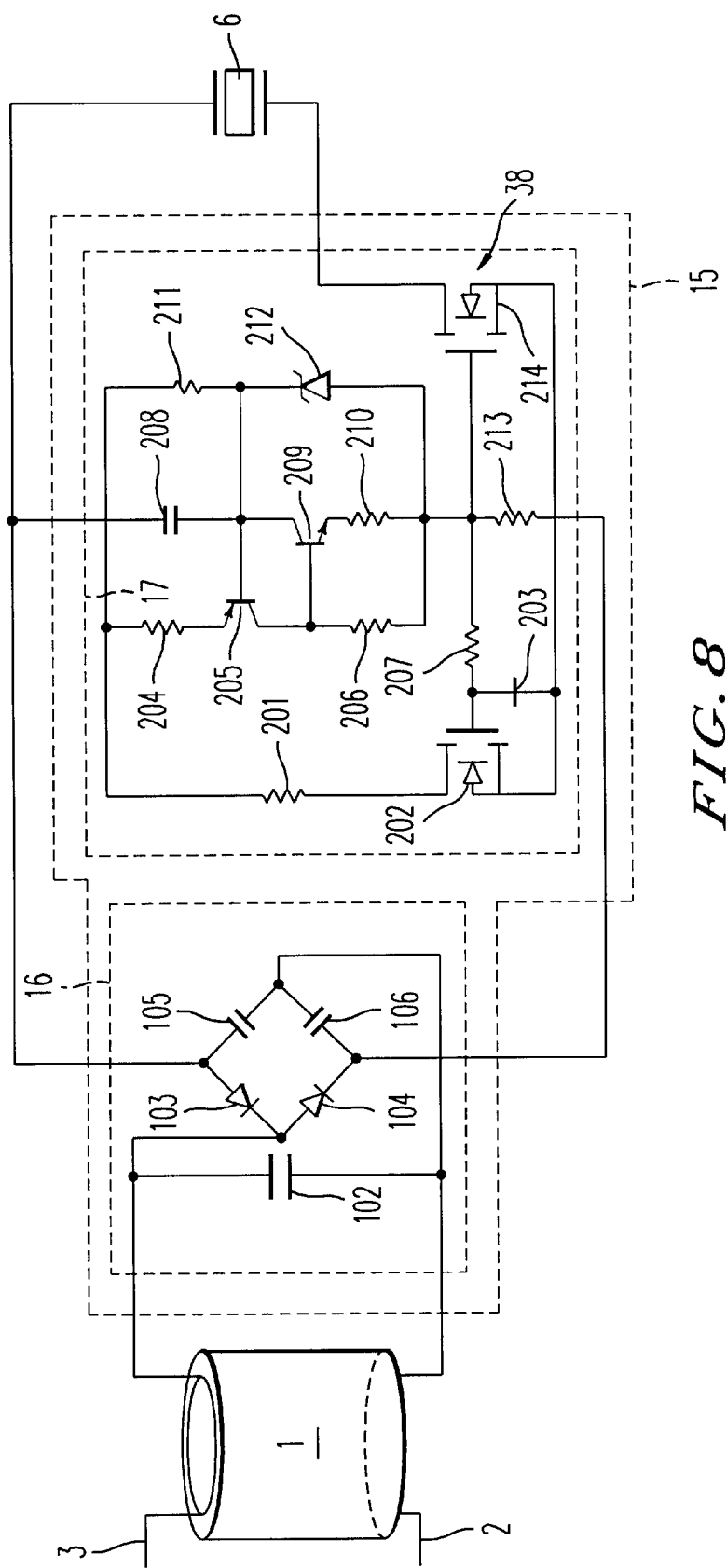
FIG. 8 is a view of a sixth embodiment of the electronic driving circuit according to the invention.

FIG. 8 is a view of a sixth embodiment of the electronic circuit according to the present invention. In this embodiment, the threshold setting means 17 comprise a first transistor 209 in which a first capacitor 208 is connected to the collector terminal and a first resistor 210 is connected to the emitter terminal. A Zener diode 212 is parallel-connected to the transistor 209, whose base terminal is connected to the collector terminal of a second transistor 205 whose collector terminal and emitter terminal are respectively connected to a second resistor 206 and to a third resistor 204.

A fourth resistor 211 is connected to the cathode terminal of the Zener diode 212. The common node of the anode of the Zener diode 212, of the first resistor 210 and of the second resistor 206 is connected to a fifth resistor 213, which is connected to a first terminal of the diode bridge in input to the threshold setting means. The common node of the first capacitor 208, of the fourth resistor 211 and of the third resistor 204 is connected to a second terminal of the diode bridge. An additional transistor 202 is connected between a seventh resistor 201 and the first terminal of the diode bridge, a second capacitor 203 is connected to said transistor 202 and to a sixth resistor 207, and a switch is connected to a common node between the fifth resistor and the sixth resistor.

The threshold setting means must be preset so as to provide the subsequent switching block with an appropriately short control pulse whose characteristics are chosen on the basis of the inductance of the coil 58 and which causes the switch to close and open rapidly. In practice, the electronic circuit according to the invention, in its different embodiments, steps up the voltage detected across the sensor 1, which is proportional to the residual current that is present between the phases of the line. The threshold setting means 17 instead determine the intervention threshold, which is proportional to the nominal value of the residual current at which the device is to intervene, i.e., at which the actuator 6 is to be actuated. In this case, an electric signal is supplied to the piezoelectric elements and causes their deformation; consequently, the portion of metallic lamina on which the piezoelectric elements are fixed flexes. In this manner, the lamina becomes unstable and snaps to a second stable position; during this movement, the lamina produces, for example, the actuation of a pin to which the release device of a residual-current circuit breaker can be operatively connected.

In practice it has been observed that the electronic circuit according to the invention fully achieves the intended aim and objects, since it achieves extremely short actuation times of the piezoelectric actuator, so as to actuate when a supply voltage reaches preset threshold values. The circuit according to the invention further has the particularity of being self-powered by the voltage that arrives from the current sensor and therefore requires no additional power supply. Furthermore, it should be noted that the electronic driving circuit according to the invention is particularly suitable for use in a residual-current circuit breaker, as previously described, or in a residual-current block, i.e. a block which is generally coupled to a thermomagnetic circuit breaker. Alternatively, it can be used in other types of circuit breaker or interruption devices, as well as in other kind of devices using a bistable piezoelectric actuator.

The electronic circuit thus conceived is susceptible of numerous modifications and variations, all of which are within the scope of the inventive concept; all the details may also be replaced with other technically equivalent elements.

What is claimed as new and desired to be secured by Letters Patent of the United States is:

1. An electronic driving circuit configured to drive a piezoelectric bistable actuator having two terminals, comprising:
    voltage step-up means for stepping up and storing a voltage generated across a secondary winding of a current sensor;
    threshold setting means connected to said voltage step-up means, for setting a voltage threshold of the bistable actuator; wherein
    said bistable actuator is activated by an excitation voltage applied across said terminals of said bistable actuator, said excitation voltage being higher than said voltage threshold.

2. The electronic driving circuit according to claim 1, further comprising switching means connected to an output of said threshold setting means, for closing a circuit and enabling said activation of said piezoelectric bistable actuator.

3. The electronic driving circuit according to claim 1, wherein said voltage step-up means comprise a first capacitor, a pair of diodes and a pair of second capacitors.

4. The electronic driving circuit according to claim 1, wherein said voltage step-up means comprise a first capacitor, a diode bridge, and a second capacitor connected to an output of said diode bridge.

5. The electronic driving circuit according to claim 1, wherein said threshold setting means comprise a surge arrester, two resistors and a diode.

6. The electronic driving circuit according to claim 1, wherein said threshold setting means comprise a divider which comprises a first resistor and a capacitor, said divider being configured to drive the gate terminal of a unijunction transistor having two second resistors connected to the source and drain terminals of said unijunction transistor respectively.

7. The electronic driving circuit according to claim 1, wherein said threshold setting means comprise a divider which is configured to define an intervention voltage for a voltage detector associated thereto.

8. The electronic driving circuit according to claim 1, wherein said threshold setting means comprise:
    a first transistor having a first collector terminal and a first emitter terminal connected to a first capacitor and a first resistor;
    a second transistor having a second collector connected to a first base terminal of said first transistor, and further having said second collector terminal and a second emitter terminal connected to a second resistor and a third resistor respectively;
    a Zener diode parallel-connected to said first transistor and having a fourth resistor connected to a cathode terminal of the Zener diode;
    a first common node connected to an anode of the Zener diode, the first resistor and the second resistor, said first common node being connected to a fifth resistor which is connected to a first terminal of a diode bridge input to the threshold setting means;
    a second common node connected to the first capacitor, the fourth resistor, and the third resistor, said second common node being connected to a second terminal of the diode bridge;
    a third transistor connected between a seventh resistor and the first terminal of the diode bridge;
    a second capacitor being connected to said third transistor and to a sixth resistor; and
    means for switching, connected to said first common node and said sixth resistor.

9. The electronic driving circuit according to claim 1, further comprising an inductor arranged in parallel to said bistable actuator, and a diode series-connected to said bistable actuator.

10. The electronic driving circuit according to claim 2, wherein said switching means comprise a bipolar transistor.

11. The electronic driving circuit according to claim 2, wherein said switching means comprise a MOSFET transistor.

12. The electronic driving circuit according to claim 2, wherein said switching means comprise an electrostatic relay.

13. The electronic driving circuit according to claim 12, wherein said electrostatic relay comprises a silicon micro-machining relay.

14. A residual-current circuit breaker comprising an electronic driving circuit which comprises, voltage step-up means for stepping up and storing a voltage generated across a secondary winding of a current sensor;

threshold setting means connected to said voltage step-up means, for setting a voltage threshold of the bistable actuator; wherein said bistable actuator is activated by an excitation voltage applied across said terminals of said bistable actuator, said excitation voltage being higher than said voltage threshold.

15. A residual-current block comprising an electronic driving circuit which comprises, voltage step-up means for stepping up and storing a voltage generated across a secondary winding of a current sensor;

threshold setting means connected to said voltage step-up means, for setting a voltage threshold of the bistable actuator; wherein said bistable actuator is activated by an excitation voltage applied across said terminals of said bistable actuator, said excitation voltage being higher than said voltage threshold.

\* \* \* \* \*